United States Patent [19]

Kowalczyk et al.

[11] Patent Number: 5,587,957
[45] Date of Patent: Dec. 24, 1996

[54] CIRCUIT FOR SHARING A MEMORY OF A MICROCONTROLLER WITH AN EXTERNAL DEVICE

[75] Inventors: Robert M. Kowalczyk; Robert H. Brown, III, both of Chandler; Jack W. Heller, Mesa, all of Ariz.

[73] Assignee: Intel Corporation, Santa Clara, Calif.

[21] Appl. No.: 537,109

[22] Filed: Sep. 29, 1995

[51] Int. Cl.⁶ ................................. G11C 8/00; G06F 9/00
[52] U.S. Cl. ................. 365/230.03; 365/230.05; 365/230.08; 395/421.01
[58] Field of Search .................... 365/230.03, 230.05, 365/230.08; 395/421.01, 775

[56] References Cited

U.S. PATENT DOCUMENTS

| | | | |
|---|---|---|---|
| 5,175,841 | 12/1992 | Magar et al. | 395/421.01 |
| 5,179,689 | 1/1993 | Leach et al. | 395/775 |
| 5,426,740 | 6/1995 | Bennett | 395/325 |
| 5,428,760 | 6/1995 | Ghori et al. | 395/425 |

Primary Examiner—David C. Nelms
Assistant Examiner—Trong Phan
Attorney, Agent, or Firm—Blakely, Sokoloff, Taylor & Zafman

[57] ABSTRACT

A device for sharing a memory of a microcontroller with an external device is provided. The device according to the present invention includes a communication unit for exchanging information between the external device and the memory, a bus controlled circuitry for exchanging information between CPU of the microcontroller and the memory. The bus control circuitry is also adapted to generate CPU status signals. The device for sharing a memory space of a microcontroller further includes memory arbitration circuitry, coupled to the communication unit and to the bus control circuitry, for receiving the CPU control status signals and responsive to this signals operatively coupling the communication unit to the memory when the CPU status signals indicate that the CPU will not access the memory for a predetermined time.

5 Claims, 9 Drawing Sheets

CIRCUIT FOR SHARING A MEMORY OF A MICROCONTROLLER WITH AN EXTERNAL DEVICE

BACKGROUND OF THE INVENTION

(1) Field of the Invention

The present invention relates to a microcontroller including an information exchange system. More particularly, the present invention pertains to an information exchange system that allows an external device to access the entire memory space of a microcontroller.

(2) Description of the Related Art

Sophisticated control systems typically use microcontrollers for controlling various features of these systems. Microcontrollers generally execute instruction from a memory located either on-board or off-board. For example, vehicle control systems can incorporate a microcontroller for controlling different functions of a car, such as the braking system of that car. Suppose that a certain function of the microcontroller, related to the braking system, may not be performing properly. In this case is would be difficult to accurately determine the reason causing the microcontroller not to perform according to the specification, by looking at the memory accessed by the microcontroller while code is executed out of this memory. Interrupting the microcontroller from the execution of code resident in the internal memory, for the purpose of accessing the internal memory, would not be desirable because such action would prevent the microcontroller from performing what is required to do. Consequently, a reading of a certain portion of the memory responsible for storing data in connection to the feature that is malfunctioning, while the microcontroller is accessing that portion of memory, would not be accurate.

FIG. 1 illustrates in block diagram form a circuit 10 for exchanging information between an external device 12 and the memory 16 which contains information accessed by a central processing unit (CPU) 18 of a microcontroller. In this configuration a dual port RAM 14 is used for exchanging information between the memory 16 and the external device 12. As one can see, the dual port RAM has one port connected to the microcontroller and another port connected to the external device. This implementation is expensive because it would require more transistors per cell in the arbitration logic. Another undesirable aspect of this implementation is that the parallel interface requires additional pins due to the increased number of address and data buses required. The increased number of pin increases the external noise affecting the circuit thereby degrading the performance and reliability of this circuit. Another disadvantage of the circuit in FIG. 1 is that the pins of the address/data bus may normally be used as digital input/output in the system. It is then necessary to implement these pins in external hardware when the dual port RAM is used.

It is, thus, desirable to provide an apparatus and method for monitoring and modifying the internal memory of a microcontroller without interrupting the microcontroller during its access to the internal memory. It is also desirable that such method and apparatus do not require the use of an expensive dual port RAM or of an emulator.

BRIEF SUMMARY OF THE INVENTION

The device for sharing a memory space of a microcontroller according to the present invention typically includes: (a) a communication unit for exchanging information between the external device and the memory; (b) bus control circuitry, for exchanging information between a CPU of the microcontroller and the memory, and for generating CPU status signals; and (c) memory arbitration circuitry, coupled to the communication unit and to the bus control circuitry, for receiving the CPU status signals and responsive thereto operatively coupling the communication unit to the memory when the CPU status signals indicate that the CPU will not access the memory for a predetermined time.

BRIEF DESCRIPTION OF THE DRAWINGS

The features, aspects, and advantages of the present invention will become more fully apparent from the following detailed description, appended claims, and the accompanying drawings in which:

DETAILED DESCRIPTION OF THE INVENTION

In the following description, numerous specific details are set forth to provide a thorough understanding of the present invention. However, one having ordinary skill in the art may be able to practice the invention without the specific details. In some instances, well-known circuits, structures and techniques have not been shown in detail not to unnecessarily obscure the present invention.

Figure 1:
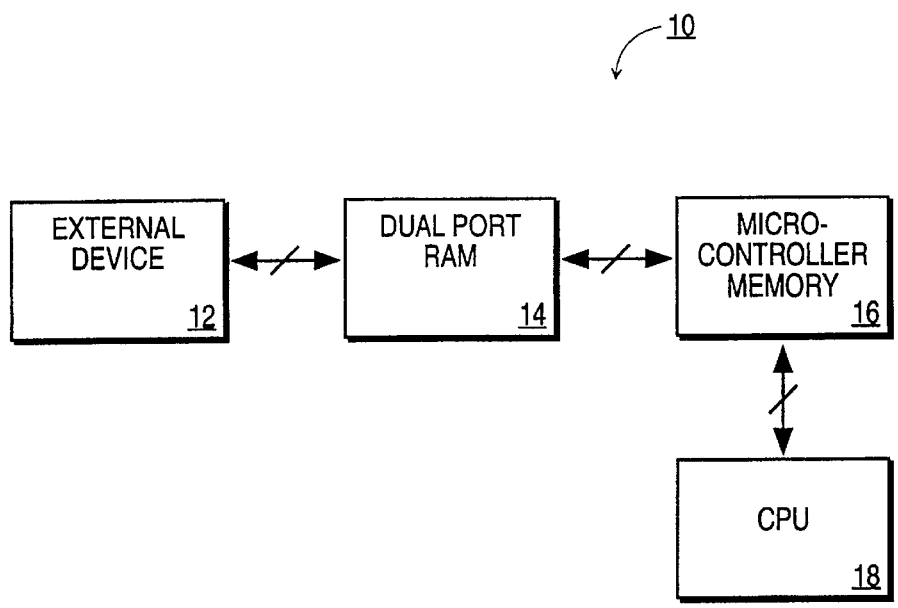
FIG. 1 is a block diagram of a conventional circuit for exchanging information between an external device and the memory of a microcontroller.
Figure 2:
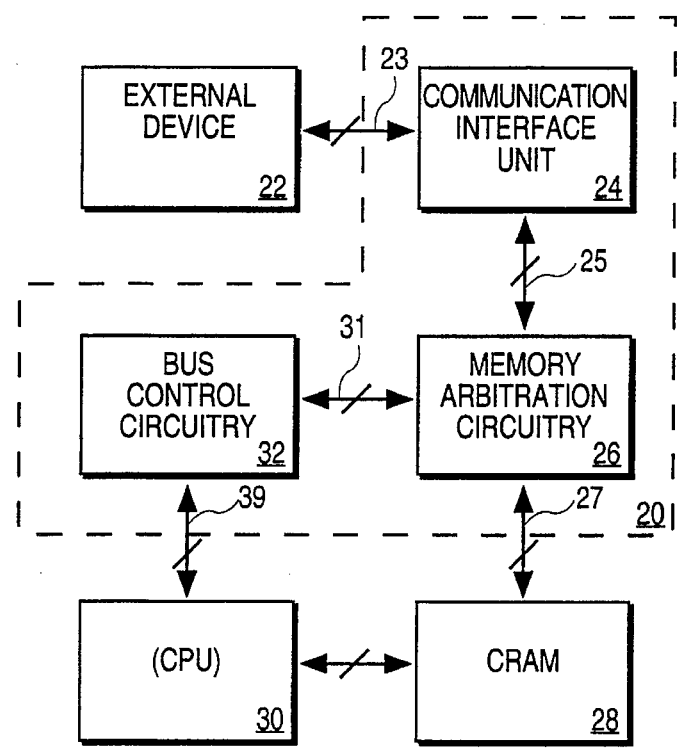
FIG. 2 is a block diagram of a circuit for exchanging information between an external device and the memory of a microcontroller.

FIG. 2 illustrates in block diagram form circuit 20 for sharing a memory space of memory 28 of a microcontroller with external device 22. As it will be described in detail below, the microcontroller includes the device 20 for sharing a memory space of the microcontroller of the present invention. As one can see from FIG. 2 the device 20 for sharing a memory space of the present invention includes: communication interface unit 24 coupled to the external device 22 via bus 23, memory arbitration circuitry 26 coupled to the communication unit 24 via bus 25, and bus control circuitry 32 coupled to the memory arbitration circuitry 26 via bus 31. The bus control circuitry 32 is coupled to the CPU 30 via bus 39 while the memory arbitration circuitry 26 is coupled to internal memory 28 of the microcontroller via bus 27.

The communication interface unit 24 controls communication between the external device 22 and the microcontroller's memory 28. The memory arbitration circuitry 26 is coupled to the bus control circuitry 32 which controls the access of the CPU to memory 28. Memory arbitration circuitry 26 permits the communication interface unit 24 interleaved access to the internal memory 28 which, in this particular embodiment, by way of non limiting example, is a RAM. More specifically, memory arbitration circuitry 26 allows access to the memory 28 when the CPU 30 is not accessing this memory.

Figure 3:
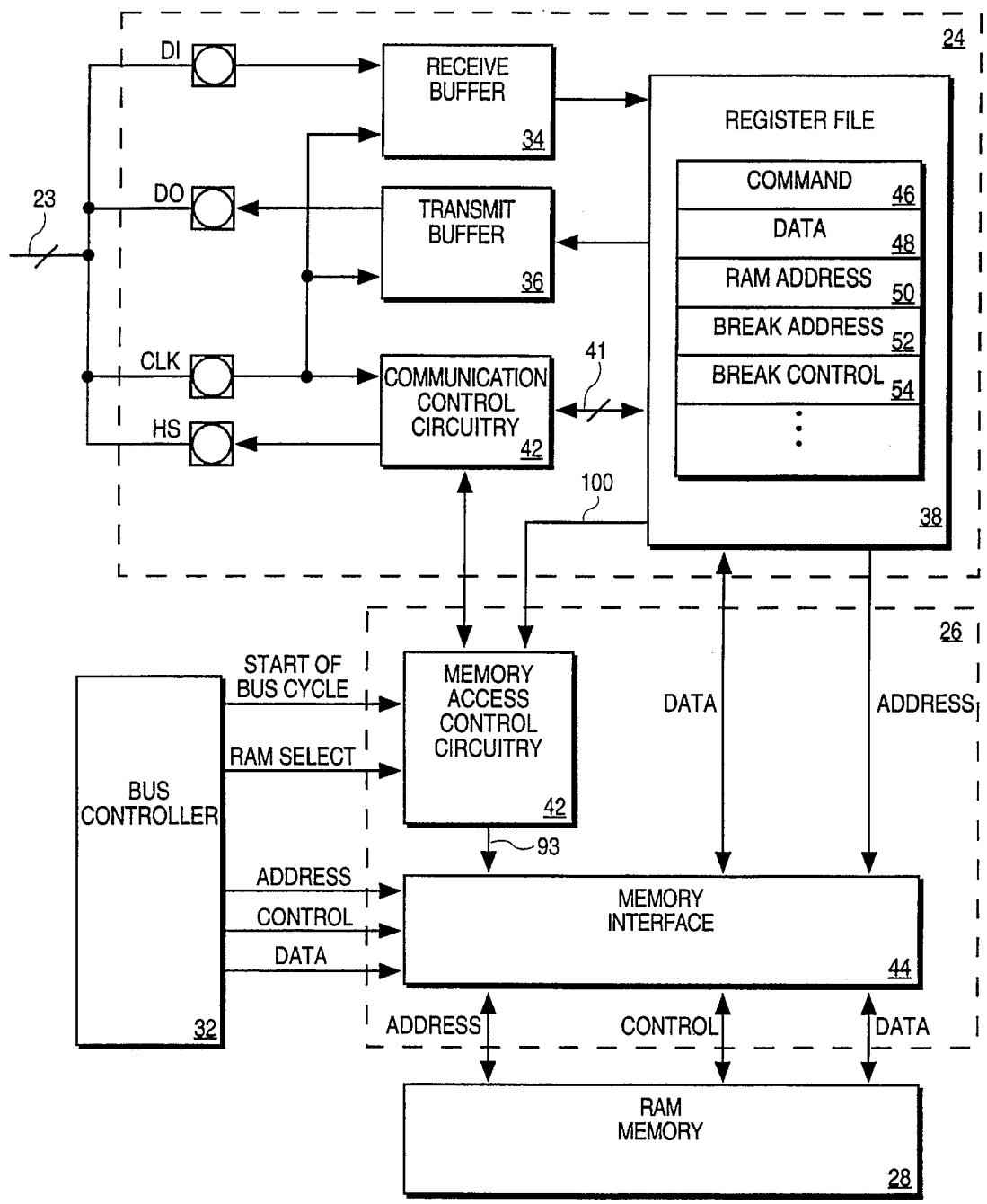
FIG. 3 is a detailed block diagram of the circuit for exchanging information between an external device and the memory of a microcontroller.

FIG. 3 illustrates in block diagram form a detailed configuration of the device for sharing a memory space of a microcontroller according to the present invention. An external device 22 (not shown) is coupled to the communication interface unit 24 via bus 23 which in this particular embodiment includes 4 bit lines. Each of these lines are coupled to one of the ports, Di, Do, Clk, and Hs of the communication interface unit 24. The communication interface unit 24, by way of non-limiting example, includes receive buffer 34, transmit buffer 36, register file 38, and communication control circuitry 40. Memory arbitration circuitry 26 includes in this particular embodiment, by way of non-limiting example, memory access control circuitry 42 and memory interface 44. The memory access control circuitry 42 includes control circuitry for determining whether the microcontroller will not access the memory for a predetermined time. The memory access control circuitry 42 is responsible for generating a memory control signal 93. The memory interface 44 includes circuitry for operatively coupling one of the external device and the microcontroller to the memory 28 in response to the memory control signal 93. The interconnections of the memory arbitration circuitry 26 and the functioning of this device will be explained in more detail later in this section.

The external device (not shown) sends information to the receive buffer 34 via data input pin (Di) of the communication interface unit. The communication interface unit transmits information from the transmit buffer 36 to the external device 22 via data output pin (Do). The communication interface unit further includes a clock pin (Clk) for coupling to a clock pulse signal generated by the external device. The receive buffer 34, the transmit buffer 36, and the register file 38 are part of a communication input/output device which, in this particular embodiment by way of non-limiting example, can be a synchronous serial I/O (SSIO). The SSIO, is provided with an additional pin Hs for handshaking. The handshake pin Hs signals to the external device whether or not the SSIO is ready to receive. The SSIO acts as a slave transmitter/receiver by serially receiving data through pin Di into receive buffer 34 and by serially transmitting data from the transmit buffer 36 via the pin Do to the external device. Accordingly, receive buffer 34 and transmit buffer 36 can be shift registers. Serial data link provides for low pin count and simple interface. Data is sent in and out of the SSIO in increments of bytes. The SSIO interface needs some time between each byte sent or received in order to process the information. In this particular embodiment, all data transfers can be initiated by the external device—the master. The data transfer in this case is full duplex.

The communication interface unit 24 further includes register file 38. The register file includes a command register 46, a data register 48, a memory address register 50, a break address register 52, and break control register 54. The command register 46 is a register that stores a command byte which typically indicates the size and the direction of the data transfer. The data register 48 stores data received from the external device or from the memory 28. The memory address register 50 stores the address of the memory to be accessed. The break address register 52 includes an address at which the micro controller should stop normal program execution and should execute a special software routine called trap. The break control register 54 is used to enable/disable the operation of the break address register 54.

An external master may be interfaced to the microcontroller through the pins Clk, Di, Do and Hs. TABLE 1, illustrated below, describes in more detail the four pins required to interface the microcontroller device of the present invention with the external device.

TABLE 1

| Pin Name | Type | Description |
| --- | --- | --- |
| Clk | Input | Clock, asynchronous external clock input. |
| Di | Input | Data In, serial instructions and data is transferred into the device. |
| Do | Output | Data Out, serial data is transferred out of the device. |
| Hs | Output | Handshake, pulled low to signal busy condition. |

The messaging form of the serial communication between the communication interface unit and the external device is generated by the external device. This messaging form has an 8-bit command byte followed by a specific number of bytes which generally contain the address high byte, the address low byte followed by the data to be transferred. Handshaking is performed through the pin Hs which indicates that the communication interface is busy when the communication interface pulls the Hs pin low. The Hs pin typically toggles low between every 8 bit command. The Hs low toggle will be a maximum of 5 CPU states unless a memory access command is in progress. This time is used to transfer data from receive buffer 34 to register file 38 and from register file 38 to transmit buffer 36 and a command decoder. This handshake pin is controlled by the communication state machine which is included in the communication interface circuitry and which will be explained in more detail later in this section. The format of the command byte stored in the register file and bit definition is described below in conjunction with TABLE 2.

TABLE 2

| Command Byte Data Register (Read/Write) | | | | | |
| --- | --- | --- | --- | --- | --- |
| Bit Acronym | SB[7] | TIN[6] | MS[5:2] | W/R#[1] | B/W#[0] |
| Bit Name | Start Bit | Interrupt | Mode Select | Write/Read# | Byte/Word# |
| Bit Definition | Always set to a zero to indicate a | Set by the user to force an interrupt | Set by the user to indicate | Used to indicate data | Used to indicate a byte |

TABLE 2-continued

| Command Byte Data Register (Read/Write) | | | | | |
|---|---|---|---|---|---|
| Bit Acronym | SB[7] | TIN[6] | MS[5:2] | W/R#[1] | B/W#[0] |
| Bit Name | Start Bit | Interrupt | Mode Select | Write/Read# | Byte/Word# |
| | valid start bit for synchronization purposes. | to the CPU. This can be used for access to user defined software 0: Do not set interrupt 1: Set interrupt. | which command the communication interface unit should execute. | direction for various debug commands. 0: Read Data from device 1: Write Data to device | or word transfer. 0: Word 1: Byte |
| Bit Status Upon reset of the Communication interface unit | Cleared | Cleared | Cleared | Cleared | Cleared |

Figure 4:
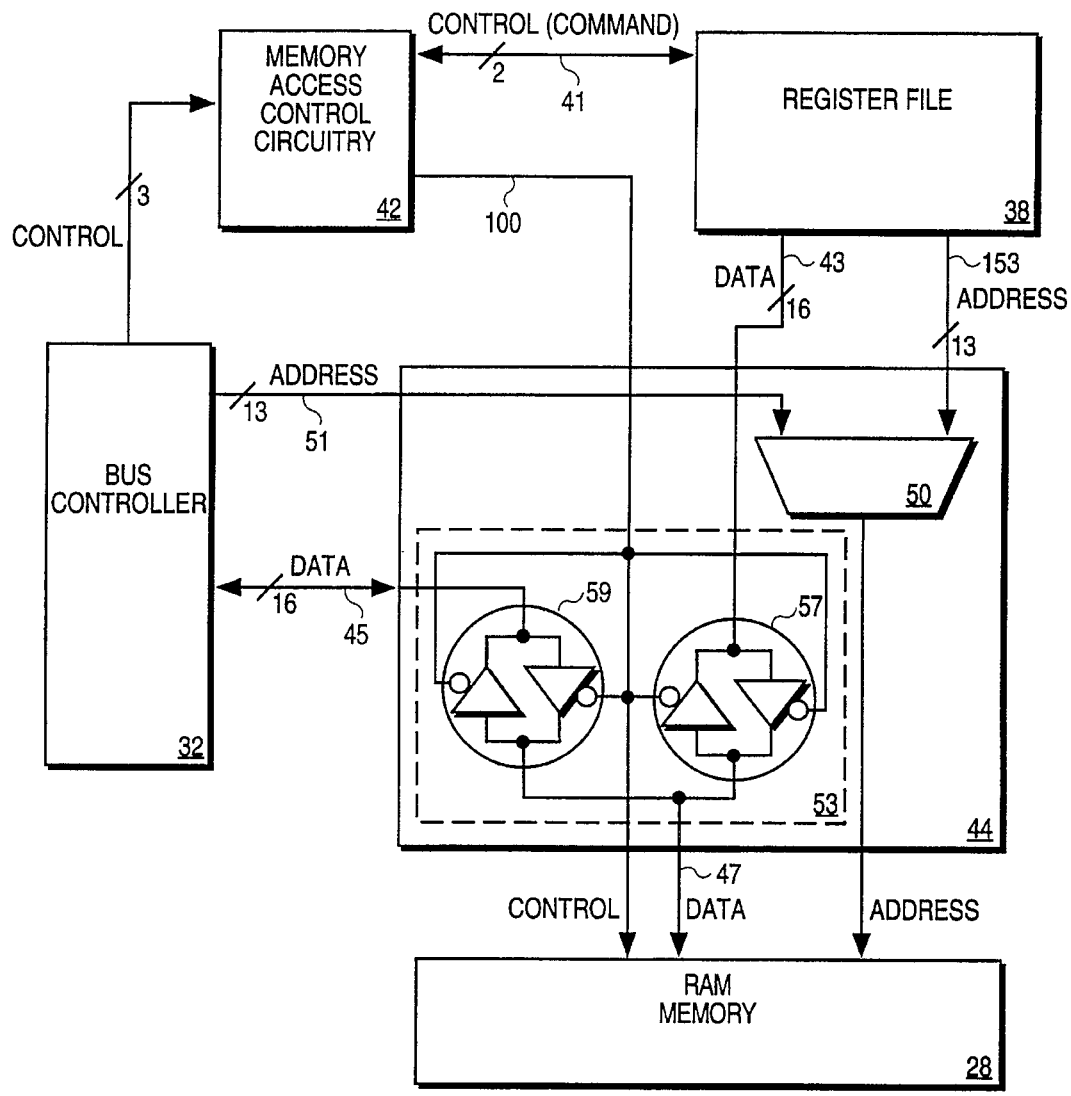
FIG. 4 shows in more detail the memory arbitration circuitry.

FIG. 4 shows a block diagram of the memory control circuitry 42 coupled via the control bus 41 to the register file 38. The line 100 is coupled to a bi-directional tristate driving circuit 53 which couples the data and control signals to the memory 28. Data can flow through the circuit 53 from data bus 43 connected to the register file 38 and from data bus 45 connected to the bus controller. Depending on the memory select signal generated by memory control circuitry on bus 100, either data bus 43 or data bus 45 are coupled to the data line 47 which is connected to the memory. Multiplexer 50 receives address line from 51 the bus controller 32 and an address line 153 from the register file 38. The memory select signal generated by the memory control circuitry via bus 100 can thus enable or disable drivers 57 or 59 corresponding to the data bus 43 and respectively to the data bus 45. Bus 100 includes more than 1 bit line. One of these bit lines carries the memory select signal.

Figure 5:
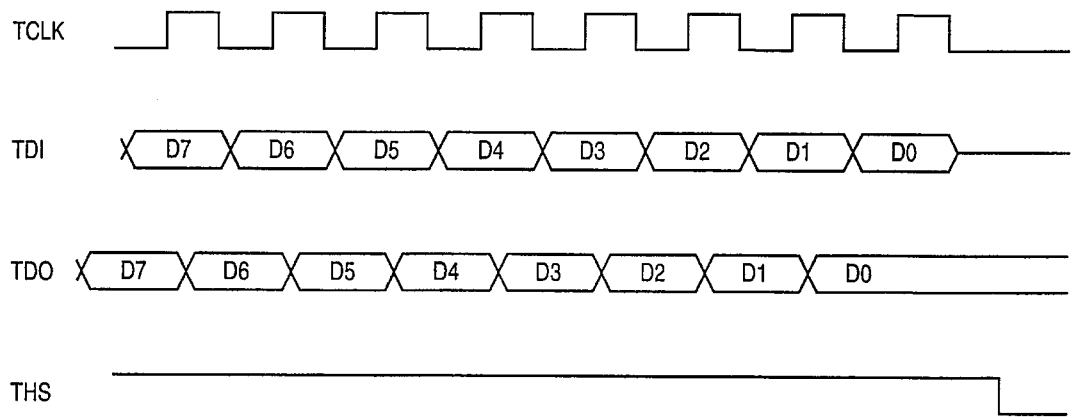
FIG. 5 shows a standard data transfer format for one byte exchanged between an external device and the device for sharing a memory of a microcontroller according to the present invention.

FIG. 5 shows the standard data transfer format for one byte of information according to the SSIO interface implemented in the present invention. The most significant bit is sent first and the less significant bit is sent last. Data is sampled and valid on the rising edge of tclk. The difference between the serial communication interface of the present invention and standard SSIO data transfer is that the output data on the pin Do changes after the rising edge but before the falling edge of the Clk signal.

Figure 6:
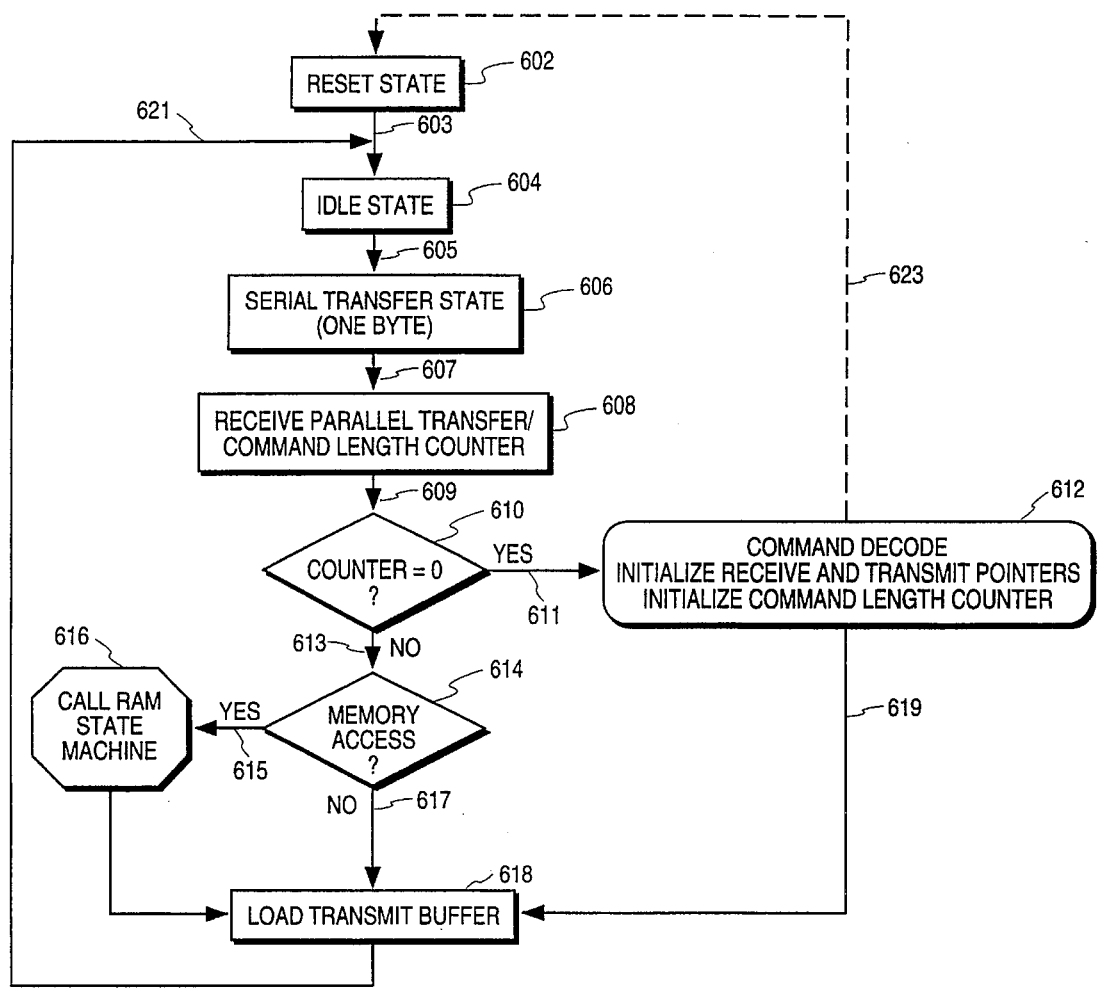
FIG. 6 is a flowchart diagram of the communication state machine.

The communication control circuitry 40 (shown in FIG. 3), is connected to the Clk pin for synchronization of the operations performed by this machine. Furthermore, the communication control circuitry 40 is connected via bus 41 to register file 38. Bus 41 selects the register into which to put the content of transmit buffer 36 and where to put data in the receive buffer 34. The communication control circuitry 40 includes a communication state machine. Depending on the information contained in the command byte which precedes each message sent by the external device, the communication state machine works according to the flow chart diagram depicted in FIG. 6

Beginning with reset block 602 the communications state machine takes flow path 603 to the idle state 604. At this step, the machine waits for the Di pin to be 0 at a rising edge of CLK. This signals the start of a command byte and flow path 605 is taken to the serial transfer state 606. Eight bits are then transmitted and received. After the eight bits are transferred, the handshake pin Hs is pulled and flow path 607 is taken to block 608. At block 608, the receive buffer 34 is transferred to the register file 38 and a receive pointer in the communications control circuit 40 is updated to point to the next byte to be received. The command length counter is decremented and flow path 609 is taken to the decision block 610. If the byte just received is a command byte then flow path 611 is taken to block 612 where the command is decoded and the receive and transmit pointers are initialized and the command length counter is loaded with the number of bytes remaining in current command.

If the command was a reset command, the machine follows flow path 623 to the reset state 602. For all other commands, flow path 619 is taken to block 618 where the transmit buffer 36 is loaded from the register in the register file 38 pointed to by the transmit pointer. The Hs pin is pulled high and flow path 621 is taken to the idle state 604.

If at decision block 610 the byte received was not a command byte, flow path 613 is taken to decision block 614. If a memory access is not needed flow path 617 is taken to block 618 and execution proceeds as described above. If a memory access is needed, flow path 615 is taken to block 616 where the memory access state machine performs the reading/writing of the memory. Once the memory access state machine completes operation, flow path 625 is taken to block 618 where the flow continues as described above.

If the communications state machine is in an unknown state when the external devices is attempting to start communication with the communication interface unit 24, the external device checks the state of the handshake Hs pin. If the Hs pin is high the external device proceeds to shift in five reset commands of the form 01111111 binary. The act of sending five reset instructions, with the requirement that the first bit of all commands must be a zero, insures that the communications interface will be resynchronized regardless of its current state.

If, however, the handshaking pin is low, meaning that the communication interface is busy, the external device must wait until the handshaking pin goes high. If the handshaking pin does not go high within an acceptable amount of time as determined by the user, it may be necessary to reset the microcontroller to allow the communications interface to recover.

Figure 7A:
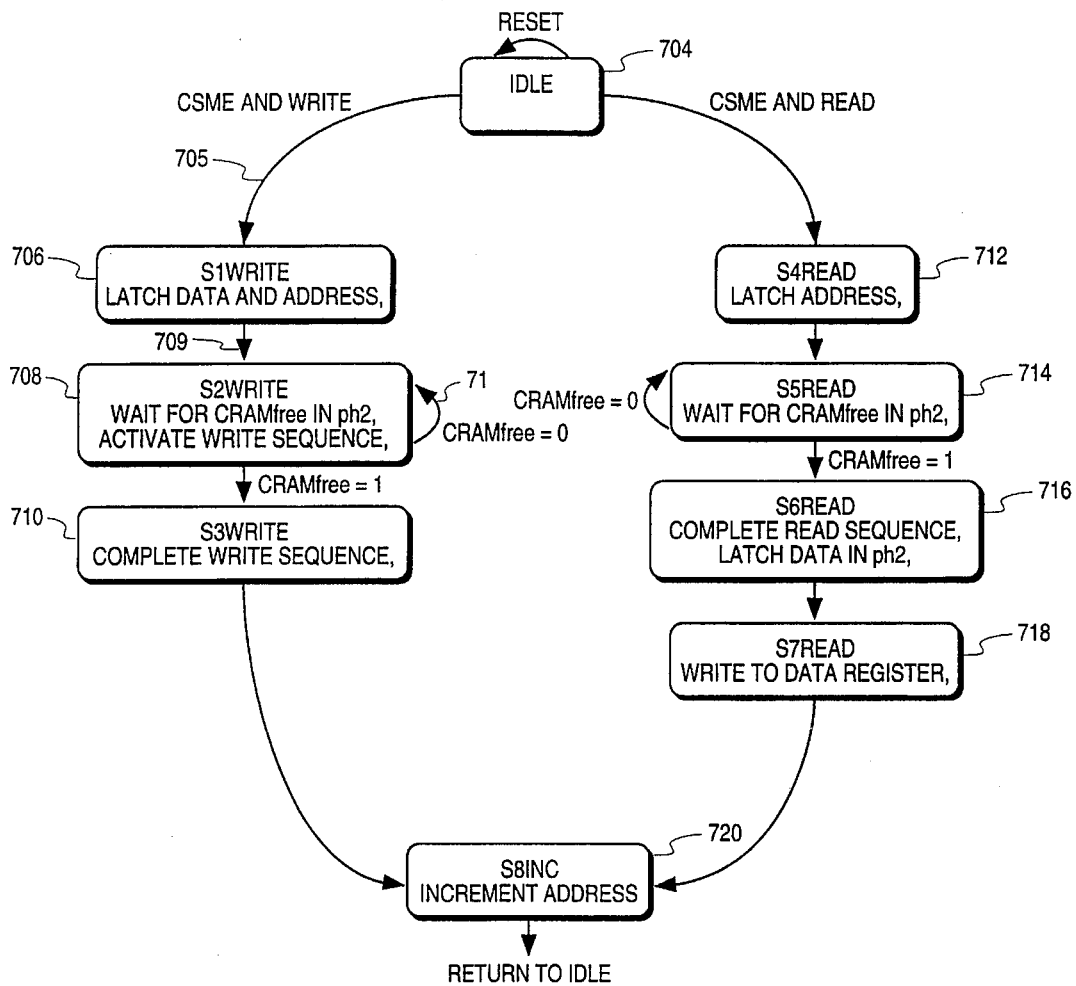
FIG. 7a is a flowchart diagram of the memory access state machine according to the present invention.

FIG. 7a illustrates a flowchart diagram of the memory access state machine, which can be included in the memory access control circuitry of the memory arbitration circuitry 26 of FIG. 2. Upon the determination that a memory access is desired, at decision block 614 of the communication state machine illustrated in FIG. 4, the device for sharing a memory space of a microcontroller with an external device transfers control of the memory access to the memory access state machine. The memory access state machine determines, at decision block 704, whether a memory read or write operation is desired by reading the bit 1 of the command register 46. This bit is transferred from the communication interface circuitry 24 to the memory arbitration circuitry 26 via bus 100. The bit "0" of the command register is checked to determine whether the external device requested a byte or word transfer. Furthermore, if a write operation is desired, the memory access state machine takes the flow path 705 to state 706. At this state, the address from the memory address register 50 is latched into a register of the memory interface circuitry 44. Furthermore, the data to be written to memory 28 is also latched to another register of the memory interface circuitry 44. The memory arbitration circuitry then remains in state 706 until the bus controller generates the CPU status signals which indicate that the microcontroller will not access the memory 28 for a predetermined time. In this particular embodiment, the CPU status signals include memory select signal and start of bus cycle signal shown in FIG. 3. These signals are generated by the bus control circuitry 32. The memory select signal indicates whether the CPU did or did not select memory 28. The start of bus cycle signal indicates the beginning of a new bus cycle of CPU 30. Generally, a bus cycle requires at least two clock cycles in order that the address and data generated by the CPU can propagate to the output of the bus controller 32. Accordingly, the receipt of both a memory select signal, indicating that the CPU did not select the memory, and of the start of bus cycle signal will indicate to the memory arbitration circuitry that the external device can share the memory 28 for a predetermined time, which in this case is at least two clock cycles. In this case, the memory access control circuitry, i.e., the memory access state machine of the arbitration circuitry enters the state 708 and generates a memory control signal to the memory interface circuitry 44. This signal disables the address and the data bus of the bus control circuitry 32 and enables the address and the data bus of the communication interface unit. A transfer of data between the communication interface unit and the memory 28 can then be initiated.

The memory access state machine according to the present invention handles a read operation similarly to a write operation. The difference is that in state 712, where the state machine determines that a read operation is desired, the data bus from the register file 38 is not latched. Rather in state 714 data read from the RAM 28 is latched and sent to the register file 38. As in the case of a write operation, all of the busses, address, data and control from the bus controller 32 are kept isolated from the RAM 28.

Figure 7B:
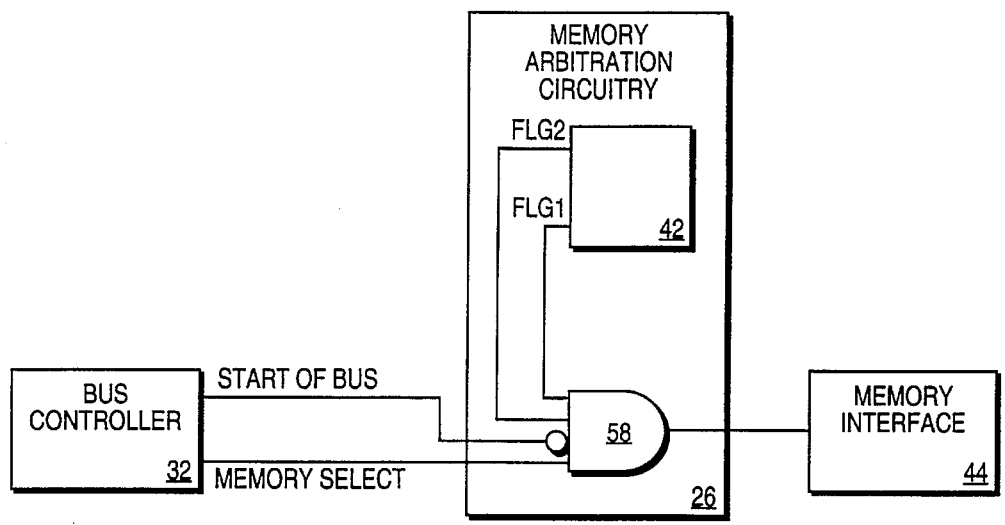
FIG. 7b shows in detail the memory arbitration circuitry of the present invention; and, FIGS. 8a and 8b illustrate time diagrams for read and write operations performed by the external device via the device according to the present invention.

FIG. 7b illustrates in more detail the memory arbitration circuitry 26. As mentioned previously, the memory arbitration circuitry 26 receives a start of bus signal and a memory select signal from the bus controller 32. In this embodiment, the memory arbitration circuitry 26 includes an AND gate 58 having at its inputs the following signals: the start of bus signal, an inverted memory select signal, a first flag (FLG1) and a second flag (FLG2). Signals FLG1 and FLG2 are generated by the memory access control circuitry 42. These signals indicate that the memory access control circuitry 42 wants to access the memory (not shown) through memory interface 44. Depending upon the inputs received at gate 58, gate 58 provides a memory control signal to the memory interface 44. The memory control signal generated by gate 58 enables the communication interface circuitry and memory 28 to exchange information.

Figure 8A:
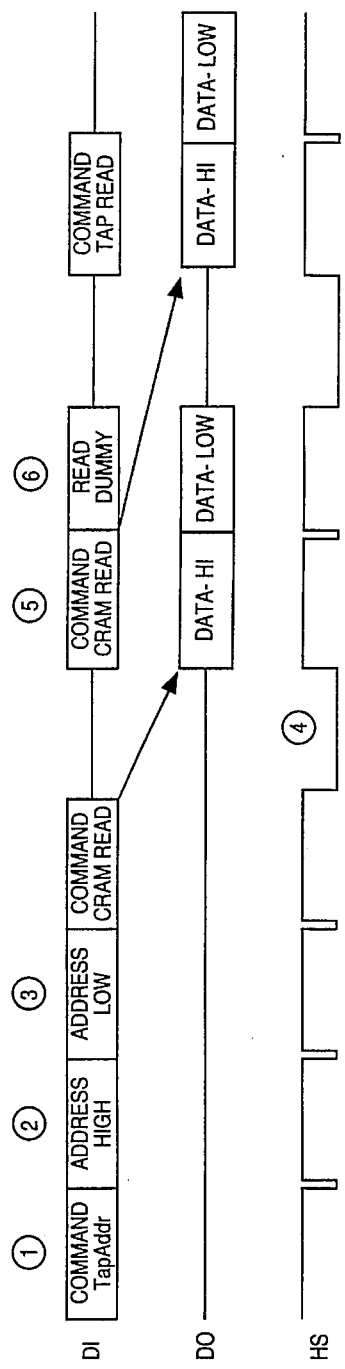
Figure 8B:
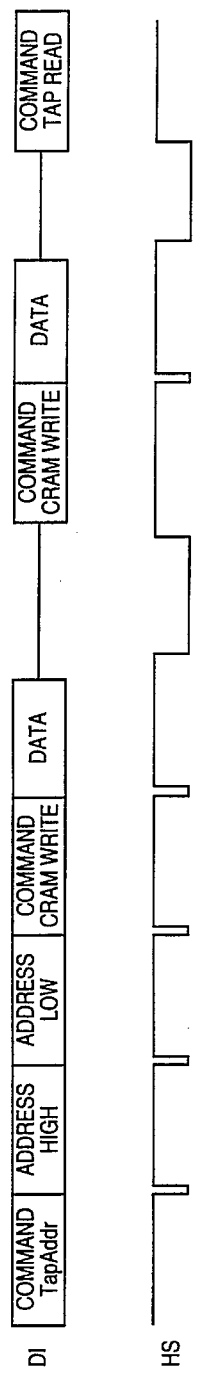

FIGS. 8a–8b illustrate a timing diagram for read and write sequences to the memory 28. FIG. 8a illustrates a read sequence for a 16-bit data read operation from memory 28. At step one a command byte is sent having the mode select segment programmed for access of the address register 50 of the register file 38. The communication interface unit will decode this instruction and accordingly will load the next two bytes sent through the receive buffer 34 into the address register 50. At step two, the receive buffer 34 shifts first the high byte of the address and subsequently shifts the low byte of the address. At step three, in this particular example, the command byte is programmed for a memory access read. In this particular case the bit 0 of the command byte is set for indicating word transfer. As one can see at step four the handshaking pin toggles low indicating to the external device that the communication interface unit is busy. During this time the communication state machine of the communication interface unit relinquishes control to the memory access state machine in order to retrieve the addressed data resident in memory 28.

When the data retrieved from memory 28 is ready for being shifted out through transmit buffer 36 the handshaking pin toggles high at step five signaling that data is available for transfer to the external device. At steps 5 and 6 data is thus transferred through the pin Do to the external device. Meanwhile during step 5 a new command byte can be received through pin Di indicating whether the read operation is to be terminated or whether a new word residing at the next 16-bit address is to be read. This sequence of operations according to the present invention confers increased speed due to the fact the communication interface unit can process instructions while at the same time sending data out through pin Do. Additionally, the messaging structure according to the present invention allows for accessing next 16-bit address without having to receive a new command byte indicating the address of the memory location to be accessed. As the command at step 5 is shifted in, the high byte of the data will be shifted out through the Do pin.

FIG. 8b shows an 8-bit memory write sequence according to the present invention. In this case bus line Do is not shown due to the fact that data is not transferred out through the external device but data is written into memory 28. In this particular example, as in the previous example the device according to the present invention does not require a new address in case an access of a block of data is required but rather command write byte is sent followed by the data to be transmitted on bus line Di.

In the foregoing specification, the invention has been described with reference to specific embodiments thereof. The specification and drawings are accordingly to be regarded in an illustrative rather than an restrictive sense. It will however be evident that various modifications and changes can be made thereto without departing from the broader spirit and scope of the invention as set forth in the appended claims.

What is claimed is:

1. A device for sharing a memory of a microcontroller with an external device said microcontroller having a CPU, said device, comprising:

a communication unit for exchanging information between said external device and said memory;

bus control circuitry for exchanging information, between said CPU of said microcontroller and said memory, and for generating CPU status signals;

memory arbitration circuitry, coupled to said communication unit and to said bus control circuitry, for receiving said CPU status signals and responsive thereto operatively coupling said communication unit to said memory when said CPU status signals indicate that said CPU will not access said memory for a predetermined time.

2. The device of claim 1 wherein said memory arbitration circuitry includes, memory access control circuitry for determining whether the CPU will not access the memory for a predetermined time, and in response for generating a memory control signal;

memory interface for operatively coupling one of said external device and said CPU to said memory in response to said memory control signal.

3. The device of claim 2 wherein said status signals include a first signal indicating a start of bus cycle and a second signal indicating whether said microcontroller will select said memory.

4. The device of claim 3 wherein said circuitry for determining whether said CPU of said microcontroller will not access said memory includes an AND gate having first and second inputs for receiving respectively said first and second signals, said AND gate further including an output for generating said memory control signal.

5. The device of claim 4 wherein said communication unit comprises, serial data in buffer for receiving information from said external device, serial data out buffer for transmitting information to said external device, a communication register device, coupled to said serial data in buffer and to said serial data out buffer, for storing information received from said external device and from said memory, communication control circuitry, coupled to said communication register device and to said memory arbitration circuitry, for controlling the exchange of information between said communication register device and said memory arbitration circuitry.

* * * * *